US009069032B2

(12) United States Patent
Hebiguchi (10) Patent No.: US 9,069,032 B2
(45) Date of Patent: *Jun. 30, 2015

(54) MAGNETIC BALANCE TYPE CURRENT SENSOR

(71) Applicant: ALPS GREEN DEVICES CO., LTD., Tokyo (JP)

(72) Inventor: Hiroyuki Hebiguchi, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 339 days.

This patent is subject to a terminal disclaimer.

(21) Appl. No.: 13/743,274

(22) Filed: Jan. 16, 2013

(65) Prior Publication Data

US 2013/0127456 A1    May 23, 2013

Related U.S. Application Data

(63) Continuation of application No. PCT/JP2011/066803, filed on Jul. 25, 2011.

(30) Foreign Application Priority Data

Aug. 23, 2010  (JP) ................................ 2010-185825

(51) Int. Cl.
*G01R 33/09*   (2006.01)
*G01R 15/20*   (2006.01)
(Continued)

(52) U.S. Cl.
CPC .............. *G01R 33/093* (2013.01); *B82Y 25/00* (2013.01); *G01R 15/205* (2013.01); *G01R 33/0041* (2013.01); *G01R 33/09* (2013.01); *G01R 15/207* (2013.01)

(58) Field of Classification Search
CPC .............................. G01R 33/09; G01R 33/093
USPC .................................................... 324/252, 249
See application file for complete search history.

(56) References Cited

U.S. PATENT DOCUMENTS 5,561,368 A    10/1996   Dovek et al.
5,831,426 A    11/1998   Black, Jr. et al.
(Continued)

FOREIGN PATENT DOCUMENTS

JP       7-318591       12/1995
JP        8-15322        1/1996
(Continued)

OTHER PUBLICATIONS

Search Report dated Oct. 25, 2011 from International Application No. PCT/JP2011/066803.

*Primary Examiner* — Reena Aurora
(74) *Attorney, Agent, or Firm* — Beyer Law Group LLP (57) ABSTRACT

A magnetic balance type current sensor includes: a magnetic detection bridge circuit of which output varies due to an induced magnetic field from a current wire; a magnetic field attenuation unit that attenuates the induced magnetic field that acts on a magnetoresistive effect element; and a feedback coil which generates a cancel magnetic field that cancels the induced magnetic field in accordance with the output of the magnetic detection bridge circuit, and through which a current corresponding to the current to be measured flows when it enters a balanced state in which the cancel magnetic field and the induced magnetic field cancel each other, wherein the feedback coil is provided in such a manner that a direction of the cancel magnetic field that acts on the magnetic field attenuation unit is opposite to a direction of the induced magnetic field that acts on the magnetic field attenuation unit.

6 Claims, 4 Drawing Sheets

(51) Int. Cl.
  *B82Y 25/00* (2011.01)
  *G01R 33/00* (2006.01)

(56) References Cited

U.S. PATENT DOCUMENTS

| | | | |
|---|---|---|---|
| 6,252,390 | B1 | 6/2001 | Black, Jr. et al. |
| 6,338,899 | B1* | 1/2002 | Fukuzawa et al. ........ 360/324.12 |
| 6,751,055 | B1* | 6/2004 | Alfoqaha et al. ........ 360/125.56 |
| 6,970,332 | B2 | 11/2005 | Tetsukawa et al. |
| 7,336,070 | B2 | 2/2008 | Sasaki et al. |
| 7,554,775 | B2 | 6/2009 | Li et al. |
| 7,639,005 | B2 | 12/2009 | Qian et al. |
| 8,269,492 | B2* | 9/2012 | Saito et al. .................... 324/252 |
| 8,487,612 | B2* | 7/2013 | Ichinohe et al. ............. 324/252 |
| 8,519,704 | B2 | 8/2013 | Ide et al. |
| 8,754,642 | B2* | 6/2014 | Ide et al. ....................... 324/252 |
| 2004/0223266 | A1 | 11/2004 | Li |
| 2005/0237676 | A1 | 10/2005 | Gill |
| 2006/0002038 | A1 | 1/2006 | Gill |
| 2006/0012927 | A1 | 1/2006 | Seino et al. |
| 2006/0077598 | A1 | 4/2006 | Taylor et al. |
| 2007/0007646 | A1 | 1/2007 | Yamaguchi et al. |
| 2007/0091509 | A1 | 4/2007 | Yi et al. |
| 2007/0297220 | A1 | 12/2007 | Yoshikawa et al. |
| 2008/0054897 | A1 | 3/2008 | Crolly et al. |
| 2008/0070063 | A1 | 3/2008 | Ibusuki et al. |
| 2008/0180863 | A1 | 7/2008 | Gill |
| 2008/0274270 | A1 | 11/2008 | Wakui et al. |
| 2009/0027813 | A1 | 1/2009 | Carey et al. |
| 2010/0141251 | A1 | 6/2010 | Ando et al. |
| 2011/0043201 | A1 | 2/2011 | Zhou |
| 2011/0121826 | A1 | 5/2011 | Engel et al. |
| 2012/0150457 | A1* | 6/2012 | Makida et al. .................. 702/57 |
| 2012/0306491 | A1 | 12/2012 | Ide et al. |
| 2012/0326715 | A1 | 12/2012 | Ide et al. |
| 2013/0278251 | A1 | 10/2013 | Ichinohe et al. |

FOREIGN PATENT DOCUMENTS

| | | |
|---|---|---|
| JP | 8-179023 | 7/1996 |
| JP | 2000-516714 | 12/2000 |
| JP | 2004-132790 | 4/2004 |
| JP | 2004-279226 | 10/2004 |
| JP | 2006-125962 | 5/2006 |
| JP | 2007-147460 | 6/2007 |
| JP | 2007-248054 | 9/2007 |
| JP | 2007-263654 | 10/2007 |
| JP | 2008-516255 | 5/2008 |
| JP | 2008-151528 | 7/2008 |
| JP | 2008-275321 | 11/2008 |
| JP | 2008-275566 | 11/2008 |
| JP | 2008-286739 | 11/2008 |
| JP | 2008-306112 | 12/2008 |
| JP | 2009-180604 | 8/2009 |
| JP | 2010-14686 | 1/2010 |
| WO | 98/07165 | 2/1998 |
| WO | WO 98/07165 | 2/1998 |

* cited by examiner

MAGNETIC BALANCE TYPE CURRENT SENSOR

CLAIM OF PRIORITY

This application is a Continuation of International Application No. PCT/JP2011/066803 filed on Jul. 25, 2011, which claims benefit of Japanese Patent Application No. 2010-185825 filed on Aug. 23, 2010. The entire contents of each application noted above are hereby incorporated by reference.

BACKGROUND OF THE INVENTION

1. Field of the Invention

The present invention relates to a magnetic balance type current sensor using a magnetoresistive effect element (a TMR element or a GMR element).

2. Description of the Related Art

In an electric vehicle, a motor is driven with electricity, and the magnitude of a current for driving a motor is detected by, for example, a current sensor. As the current sensor, for example, a magnetic balance type current sensor, in which a circular magnetic core that collects a magnetic flux due to a current to be measured is provided around a conductor, a magnetic detecting element is disposed at a core gap (cut-out portion) of the magnetic core, and a negative feedback coil is wound around a circular portion of the magnetic core, is disclosed (for example, refer to Japanese Unexamined Patent Application Publication No. 2004-279226).

The magnetic balance type current sensor disclosed in Japanese Unexamined Patent Application Publication No. 2004-279226 is operated in such a manner that when a current flows to the conductor, an output from the magnetic detecting element is converted into a current and is fed back to the negative feedback coil, and an induced magnetic field due to a current to be measured is canceled by a cancel magnetic field that is generated in the negative feedback coil, and then the current that flows through the negative feedback coil is taken out as an output. In addition, this current sensor is provided with a reset circuit portion that allows a saturation remanent magnetization to stably occur with respect to the magnetic core, and suppresses an output fluctuation due to a variation in the remanent magnetization during power supply start-up or an abnormal decrease in power supply.

However, in the magnetic balance type current sensor disclosed in Japanese Unexamined Patent Application Publication No. 2004-279226, measurement accuracy is improved through adjustment of the remanent magnetism, but hysteresis occurs due to an effect of the remanent magnetism. Furthermore, since the magnetic balance type current sensor is provided with the magnetic core, miniaturization is not realized, and it is necessary to provide the conductor, which allows a current to be measured to flow, at the inner side of the magnetic core. Therefore, there is a problem in that workability deteriorates during installation.

SUMMARY OF THE INVENTION

The present invention provides a magnetic balance type current sensor that is capable of improving miniaturization of the sensor and workability during installation thereof, and that is capable of increasing measurement accuracy by reducing hysteresis.

According to an embodiment of the present invention, there is provided a magnetic balance type current sensor including: a magnetic sensor of which output varies due to an induced magnetic field from a current wire through which a current to be measured flows; a magnetic field attenuation unit that attenuates the induced magnetic field that acts on the magnetic sensor; and a feedback coil which generates a cancel magnetic field that cancels the induced magnetic field in accordance with the output of the magnetic sensor, and through which a current corresponding to the current to be measured flows when it enters a balanced state in which the cancel magnetic field and the induced magnetic field cancel each other, wherein the feedback coil is provided in such a manner that a direction of the cancel magnetic field that acts on the magnetic field attenuation unit is opposite to a direction of the induced magnetic field that acts on the magnetic field attenuation unit.

According to this configuration, since the induced magnetic field that is applied to the magnetic field attenuation unit may be weakened by the cancel magnetic field of the feedback coil, it is difficult for the magnetic field attenuation unit to be magnetically saturated, and thus hysteresis may be made small and measurement accuracy may increase. In addition, compared to a configuration in which a magnetic sensor is disposed at a core gap of the magnetic core, miniaturization of the sensor and workability during installation thereof may be improved.

In the magnetic balance type current sensor of the present invention, it is preferable that the magnetic field attenuation unit be disposed between the magnetic sensor and the current wire. According to this configuration, the induced magnetic field that acts on the magnetic sensor may be effectively attenuated by the magnetic field attenuation unit.

In the magnetic balance type current sensor of the present invention, it is preferable that the feedback coil be formed in a tube shape capable of disposing the magnetic sensor and the magnetic field attenuation unit at an inner side thereof. According to this configuration, since the magnetic sensor and the magnetic field attenuation unit are constructed to be disposed at an inner side of the coil, miniaturization of the sensor may be easily realized.

In the magnetic balance type current sensor of the present invention, it is preferable that the feedback coil be a planar coil. According to this configuration, since the feedback coil is a planar coil, the sensor may be easily thinned. Furthermore, enlargement of the cancel magnetic field that is generated from the feedback coil is suppressed, and thus an effect on peripheral circuits is reduced.

In the magnetic balance type current sensor of the invention, it is preferable that the magnetic sensor, the magnetic field attenuation unit, and the feedback coil be laminated in this order with respect to a substrate or in an order of the feedback coil, the magnetic field attenuation unit, and the magnetic sensor. According to this configuration, since the magnetic sensor, the magnetic field attenuation unit, and the feedback coil are integrated, workability during installation may be improved.

According to the magnetic balance type current sensor of the present invention, the magnetic balance type current sensor includes: a magnetic sensor of which output varies due to an induced magnetic field from a current wire through which a current to be measured flows; a magnetic field attenuation unit that attenuates the induced magnetic field that acts on the magnetic sensor; and a feedback coil which generates a cancel magnetic field that cancels the induced magnetic field in accordance with the output of the magnetic sensor, and through which a current corresponding to the current to be measured flows when it enters a balanced state in which the cancel magnetic field and the induced magnetic field cancel each other. The feedback coil is provided in such a manner that a direction of the cancel magnetic field that acts on the magnetic field attenuation unit is opposite to a direction of the induced magnetic field that acts on the magnetic field attenuation unit. Accordingly, miniaturization of the sensor and workability during installation thereof may be improved, and the hysteresis is made small and thus measurement accuracy may be increased.

DESCRIPTION OF THE PREFERRED EMBODIMENTS

Recently, accompanying large output and high performance of an electric vehicle, a current value that is handled is increasing, and thus it is necessary to avoid magnetic saturation with a large current. For example, in a magnetic balance type current sensor using a circular magnetic core, it is necessary to make the magnetic core large so as to avoid the magnetic saturation, but when the magnetic core is enlarged, there is a problem in that the size of the sensor itself increases. To solve a problem of the current sensor using this magnetic core, a magnetic balance type current sensor using a magnetoresistive effect element without using the magnetic core has been suggested.

However, in the magnetic balance type current sensor using the magnetoresistive effect element without using the magnetic core, when a current value that is treated becomes large, a large cancel magnetic field is generated. Therefore, a feedback current becomes large, and thus there is a problem in that power consumption increases. Therefore, a magnetic balance type current sensor as shown in FIG. 6 may be considered.

Figure 6:
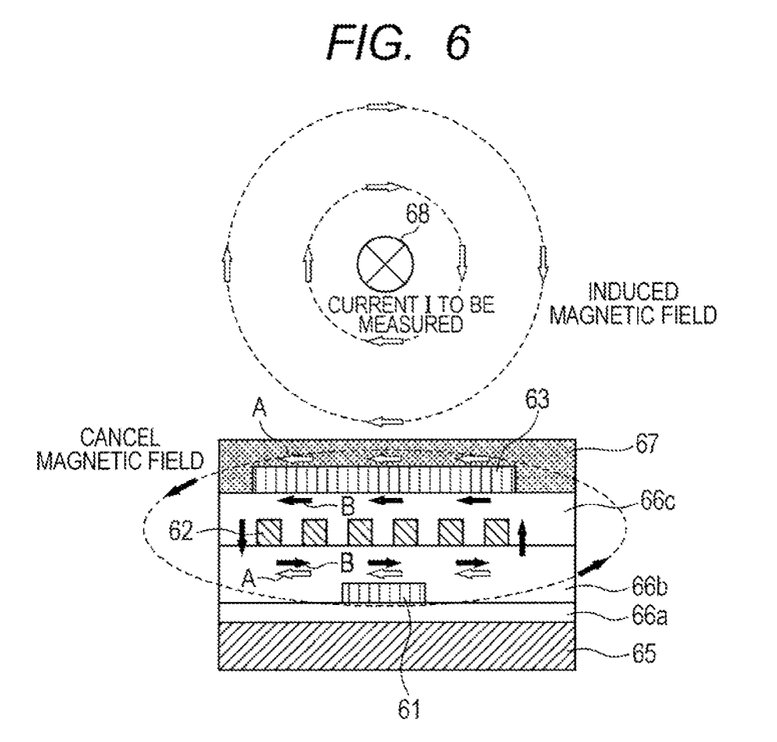
FIG. 6 is a diagram illustrating another magnetic balance type current sensor.

As shown in FIG. 6, the magnetic balance type current sensor is constructed by forming a magnetic sensor 61, a feedback coil 62, and a magnetic field attenuation unit 63 on the same substrate 65. A plurality of interlayer insulating films 66a, 66b, and 66c, and a protective film 67 are laminated on the substrate 65, the magnetic sensor 61 is formed on the interlayer insulating film 66a, the feedback coil 62 is formed on the interlayer insulating film 66b, and the magnetic field attenuation unit 63 is formed on the interlayer insulating film 66c. According to this configuration, the magnetic sensor 61 may be the farthest from a conductor 68, and thus an induced magnetic field, which is applied to the magnetic sensor 61 from a current I to be measured, may be made small. In addition, the magnetic field attenuation unit 63 may be closest to the conductor 68, and thus an attenuation effect of the induced magnetic field may increase.

As described above, in the magnetic balance type current sensor, since the induced magnetic field, which is applied to the magnetic sensor 61, decreases, a current, which flows to the feedback coil 62, may be made small. Accordingly, electric power saving may be realized. Furthermore, since the magnetic sensor 61, the feedback coil 62, and the magnetic field attenuation unit 63 are formed on the same substrate 65, miniaturization of the sensor may be realized.

However, in the above-described magnetic balance type current sensor, an induced magnetic field A from the current to be measured and a cancel magnetic field B from a feedback current are applied with respect to the magnetic field attenuation unit 63 in the same direction. Therefore, a magnetic filed, which is applied to the magnetic field attenuation field 63, increases, and thus there is a concern that magnetic saturation of the magnetic field attenuation unit 63 easily occurs, and hysteresis occurs.

The present inventors have given attention to the above-described circumstances and have found that when a feedback coil is provided in such a manner that a direction of the cancel magnetic field B is opposite to a direction of the induced magnetic field A that is applied to the magnetic field attenuation unit, magnetic saturation of the magnetic field attenuation unit is suppressed and thus hysteresis can be decreased, and they have accomplished the present invention. Specifically, the gist of the invention is to make hysteresis small so as to increase measurement accuracy by the magnetic balance type sensor in which the feedback coil is provided in such a manner that the direction of the cancel magnetic field that acts on the magnetic field attenuation unit is opposite to the direction of the induced magnetic field that acts on the magnetic field attenuation unit. In addition, when the magnetic sensor, the feedback coil, and the magnetic field attenuation unit are formed on the same substrate without using the magnetic core, miniaturization of the sensor and workability during installation thereof may be improved. In addition, when the direction of the cancel magnetic field that is applied to the magnetic field attenuation unit and the direction of the induced magnetic field that is applied to the magnetic field attenuation unit are opposite to each other, it is not necessary for the directions to be exactly opposite to each other, and the directions may be opposite to each other within a range exhibiting the effect of the present invention.

Hereinafter, an embodiment of the present invention will be described in detail with reference to the attached drawings.

Figure 1:
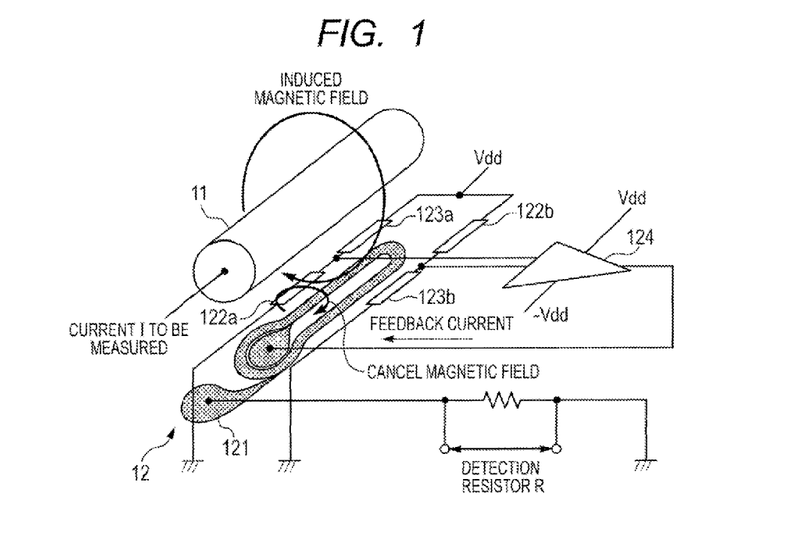
FIG. 1 is a diagram illustrating a magnetic balance type current sensor related to an embodiment of the present invention.
Figure 2:
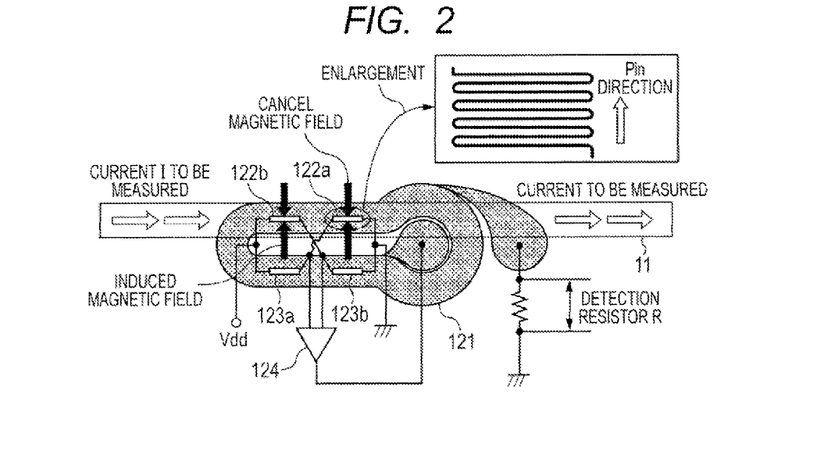
FIG. 2 is a diagram illustrating the magnetic balance type current sensor related to the embodiment of the present invention.

FIGS. 1 and 2 show diagrams illustrating a magnetic balance type current sensor related to an embodiment of the present invention. In this embodiment, the magnetic balance type current sensor shown in FIGS. 1 and 2 is disposed in the vicinity of a conductor 11 through which a current I to be measured flows. The magnetic balance type current sensor is provided with a feedback circuit 12 that causes a magnetic field (a cancel magnetic field), which cancels an induced magnetic field due to the current I to be measured that flows through the conductor 11, to occur. The feedback circuit 12 includes a feedback coil 121 that is wound in a direction to cancel the magnetic field that occurred due to the current I to be measured, two magnetoresistive effect elements 122a and 122b (may be collectively referred to as magnetoresistive effect elements 122) that are magnetic detection elements, and two fixed-resistance elements 123a and 123b.

The feedback coil 121 is constructed as a planar coil (for example, a flat spiral coil). In this configuration, since the magnetic coil is not provided, the feedback coil may be manufactured at a low cost. In addition, compared to a case of a solenoid coil, the cancel magnetic field that occurs from the feedback coil may be prevented from widely spreading and thus an effect on peripheral circuits may be avoided. Furthermore, in a case where the current to be measured is an alternating current, a control of the cancel magnetic field using the feedback coil becomes easier and a current that is allowed to flow for the control does not increase to that degree compared to the case of the solenoid coil. When the current to be measured has a high frequency of an alternating current, this effect increases. In a case of constructing the feedback coil 121 as a planar coil, it is preferable that the planar coil is provided in such a manner that both the induced magnetic field and the cancel magnetic field are made to occur in a plane that is parallel with a plane on which the planar coil is formed.

A resistance value of magnetoresistive effect elements 122 varies due to application of the induced magnetic field from the current I to be measured. The two magnetoresistive effect elements 122a and 122b make up a magnetic field detection bridge circuit in combination with the two fixed-resistance elements 123a and 123b. In this manner, when the magnetic field detection bridge circuit including the magnetoresistive effect elements is used, a magnetic balance type current sensor with high sensitivity may be realized. In addition, when the magnetic field detection bridge circuit is constructed by combining magnetoresistive effect elements of which resistance values increases or decreases due to application of the induced magnetic field from the current I to be measured without using the fixed-resistance element, a magnetic balance type current sensor with further higher sensitivity may be realized.

The magnetic field detection bridge circuit includes two outputs in which a voltage difference corresponding to the induced magnetic field, which occurs due to the current I to be measured, occurs. In the magnetic field detection bridge circuit shown in FIG. 2, a power supply Vdd is connected to a connection point between the magnetoresistive effect element 122b and the fixed-resistance element 123a, and a ground (GND) is connected to a connection point between the magnetoresistive effect element 122a and the fixed-resistance element 123b. Furthermore, in the magnetic field detection bridge circuit, one output is taken out from a connection point between the magnetoresistive effect element 122a and the fixed-resistance element 123a, and another output is taken out from a connection point between the magnetoresistive effect element 122b and the fixed-resistance element 123b. These two outputs are amplified by an amplifier 124, and are supplied to the feedback coil 121 as a current (a feedback current). This feedback current corresponds to a voltage difference corresponding to the induced magnetic field. At this time, a cancel magnetic field that cancels the induced magnetic field occurs in the feedback coil 121. In addition, the current to be measured is measured at a detection unit (a detection resistor R) on the basis of a current that flows through the feedback coil 121 when it enters a balanced state at which the induced magnetic field and the cancel magnetic field cancel each other.

Figure 3:
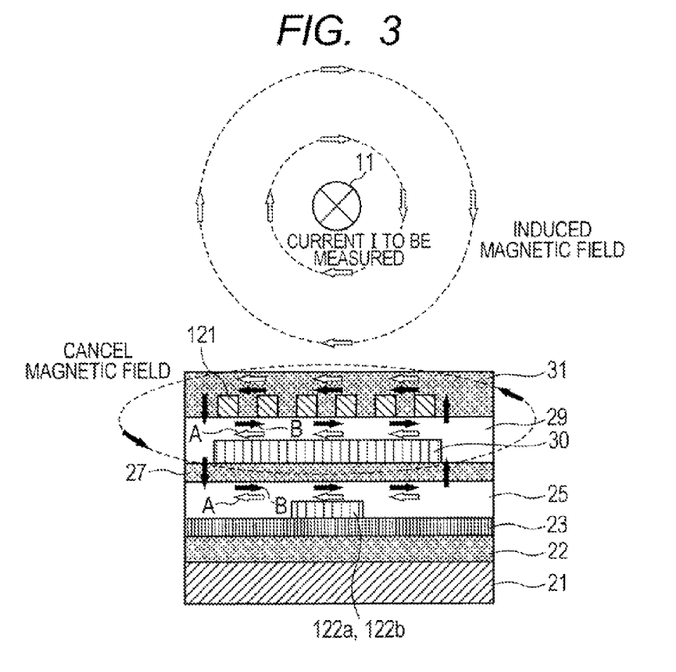
FIG. 3 is a cross-sectional diagram of the magnetic balance type current sensor shown in FIG. 1.

FIG. 3 shows a cross-sectional diagram illustrating the magnetic balance type current sensor shown in FIG. 1. As shown in FIG. 3, in the magnetic balance type current sensor related to this embodiment, the feedback coil 121, a magnetic field attenuation unit 30, and the magnetic field detection bridge circuit are formed on the same substrate 21. In the configuration shown in FIG. 3, the magnetic field attenuation unit 30 having a thin plate shape is disposed between the feedback coil 121 and the magnetic field detection bridge circuit, and the feedback coil 121 is disposed on a side close to the current I to be measured. That is, the feedback coil 121, the magnetic field attenuation unit 30, and the magnetoresistive effect elements 122 are disposed in this order from a side close to the conductor 11. According to this, the magnetoresistive effect elements 122 may be the farthest from the conductor 11, and thus the induced magnetic field that is applied to the magnetoresistive effect elements 122 from the current I to be measured may be made small. In addition, since the magnetic field attenuation unit 30 is disposed to be closer to the conductor 11 side compared to the magnetoresistive effect elements 122, an effect of attenuating the induced magnetic field with respect to the magnetoresistive effect elements 122 may be relatively increased. Furthermore, when the feedback coil is provided in such a manner that a direction of the cancel magnetic field B is opposite to a direction of the induced magnetic field A that is applied to the magnetic field attenuation unit 30, magnetic saturation in the magnetic field attenuation unit 30 is suppressed and thus hysteresis is made small, whereby measurement accuracy may increase.

Hereinafter, an example of a layer configuration shown in FIG. 3 will be described in detail. In the magnetic balance type current sensor shown in FIG. 3, a silicon thermal oxide film 22, which is an insulating layer, is formed on the substrate 21. An aluminum oxide film 23 is formed on the silicon thermal oxide film 22. The aluminum oxide film 23 may be formed by a method such as sputtering. In addition, a silicon substrate or the like may be used as the substrate 21.

The magnetoresistive effect elements 122a and 122b are formed on the aluminum oxide film 23. At this time, the fixed-resistance elements 123a and 123b are provided in combination with the magnetoresistive effect elements 122a and 122b, whereby the magnetic field detection bridge circuit is obtained. As the magnetoresistive effect elements 122a and 122b, a TMR element (tunnel type magnetoresistive effect element), a GMR element (giant magnetoresistive effect element), or the like may be used. For example, as the GMR element, a spin valve type GMR element or a spin vale type TMR element, which is constructed by a multi-layer film having an antiferromagnetic layer, a fixed magnetic layer, and a free magnetic layer, may be used.

As the spin valve type GMR element, a GMR element having a meander shape as shown in an enlarged view of FIG. 2 is preferable. In this meander shape, in consideration of linearity, it is preferable that a width D in a pin direction be 1 μm to 10 μm. In this case, in consideration of the linearity, it is preferable that a longitudinal direction is orthogonal to both the direction of the induced magnetic field and the direction of the cancel magnetic field. When constructed in the meander shape, an output of the magnetoresistive effect element may be taken out in the number of terminals (two terminals) smaller than that of a hall element.

In addition, in consideration of the linearity, it is preferable that the spin valve type TMR element have a rectangular shape in which a width in a pin direction is 1 μm to 10 μm. In this case, in consideration of the linearity, it is preferable that a longitudinal direction be orthogonal to both the direction of the induced magnetic field and the direction of the cancel magnetic field.

On the aluminum oxide film 23 on which the magnetoresistive effect elements 122a and 122b are formed, a polyimide layer 25 is formed as an insulating layer. The polyimide layer 25 may be formed by applying a polyimide material and curing this applied polyimide material.

On the polyimide layer 25, a silicon oxide film 27 is formed. The silicon oxide film 27 may be formed, for example, by a method such as sputtering.

The magnetic field attenuation unit 30 is formed on the silicon oxide film 27. As a constituent material of the magnetic field attenuation unit 30, a high-permeability material such as an amorphous magnetic material, a Permalloy-based magnetic material, and a fine crystalline material may be used.

On the silicon oxide film 27 on which the magnetic field attenuation unit 30 is formed, a polyimide layer 29 is formed as an insulating layer. The polyimide layer 29 may be formed by applying a polyimide material and then curing this applied polyimide material.

The feedback coil 121 is formed on the polyimide layer 29. The feedback coil 121 may be formed by forming a film of a coil material and by performing photolithography and etching. Alternatively, the feedback coil 121 may be formed by forming a film of an underlying layer material and by performing photolithography and plating.

On the polyimide layer 29 on which the feedback coil 121 is formed, a silicon oxide film 31 is formed as a protective film. For example, the silicon oxide film 31 may be formed by a method such as sputtering.

In the magnetic balance type current sensor having this configuration, as shown in FIG. 3, an adjustment is made appropriately so that the induced magnetic field A that occurs from the current I to be measured is received and fed back by the magnetoresistive effect elements 122a and 122b, the cancel magnetic field B occurs from the feedback coil 121, the two magnetic fields (the induced magnetic field A and the cancel magnetic field B) cancel each other, and thus a magnetic field that is applied to the magnetoresistive effect elements 122 becomes zero.

In the magnetic balance type current sensor of the present invention, as shown in FIG. 3, the magnetic field attenuation unit 30 is provided to be adjacent to the feedback coil 121 on the magnetoresistive effect elements 122 side. The magnetic field attenuation unit 30 attenuates the induced magnetic field that occurs from the current I to be measured and is applied to the magnetoresistive effect elements 122a and 122b. The feedback coil 121 generates the cancel magnetic field B so as to cancel the induced magnetic field that occurs from the current I to be measured and is applied to the magnetoresistive effect elements 122, and to attenuate the induced magnetic field that is applied to the magnetic field attenuation unit 30 (in the magnetoresistive effect element and the magnetic field attenuation unit, the direction of the induced magnetic field A and the direction of the cancel magnetic field B are opposite to each other). Accordingly, the magnetic saturation of the magnetic field attenuation unit 30 is suppressed, and the hysteresis may be made sufficiently small.

In the magnetic balance type current sensor having the above-described configuration, as the magnetic detection element, the magnetoresistive effect element, particularly, the magnetic field detection bridge circuit provided with the GMR element or the TMR element is used. Accordingly, a magnetic balance type current sensor with high sensitivity may be realized. In addition, according to this configuration, when using the GMR element or the TMR element in which a temperature-depending variation of a resistance change rate is small while TCR (Temperature Coefficient Resistivity) of the magnetoresistive effect elements and the fixed-resistance elements is made to coincide in each case, temperature dependency of an output may be made small, and thus temperature characteristics may be improved. In addition, in the magnetic balance type current sensor having the above-described configuration, since the feedback coil 121, the magnetic field attenuation unit 30, and the magnetic field detection bridge circuit are formed on the same substrate, miniaturization may be realized. Furthermore, this magnetic balance type current sensor has a configuration in which the magnetic core is not provided, miniaturization and cost reduction may be realized.

Next, description will be made with resect to linear characteristics of the magnetic balance type current sensor having the above-described configuration.

Figure 4:
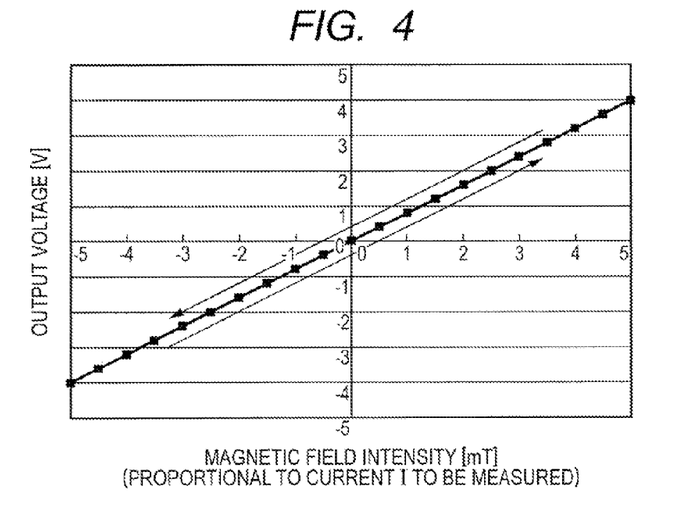
FIG. 4 is a diagram illustrating a relationship between magnetic field intensity and an output voltage of the magnetic balance type current sensor related to the embodiment of the present invention.

FIG. 4 shows a diagram illustrating a relationship between a magnetic field intensity [mT] and an output voltage [V] of the magnetic balance type current sensor related to the present invention. In addition, in FIG. 4, the magnetic field intensity is proportional to the current I to be measured. In the magnetic balance type current sensor related to the present invention, even when the current I to be measured becomes large and thus a large induced magnetic field is applied to the magnetic field attenuation unit 30, since a cancel magnetic field due to a feedback current is applied with respect to the magnetic field attenuation unit 30 in an opposite direction, it is difficult for the magnetic field attenuation unit 30 to be magnetically saturated. Accordingly, as shown in FIG. 4, linearity is maintained in a satisfactory manner without a gradient variation midway in a wide range.

In addition, since it is difficult for the magnetic field attenuation unit 30 to be magnetically saturated, for example, even when the current I to be measured is large, a magnetic field intensity is set to +5 [mT], and then the magnetic field intensity is made to vary in a negative direction, an output voltage varies in a linear type that passes through the origin. In addition, in a case where the magnetic field intensity is set to −5 [mT] and then the magnetic field intensity is made to vary in a positive direction, the output voltage varies in the approximately same linear type as the case where the magnetic field intensity is made to vary in the negative direction. In this case, a variation between output characteristics in the case of making the magnetic field intensity vary in the positive direction and output characteristics in the case of making the magnetic field intensity vary in the negative direction becomes a measurement error. However, in the magnetic balance type current sensor related to the present invention, the variation in the output characteristics is small and thus the measurement error is small. In this manner, in the magnetic balance type current sensor related to this embodiment, the hysteresis is made sufficiently small and thus measurement accuracy may be increased.

Figure 5A:
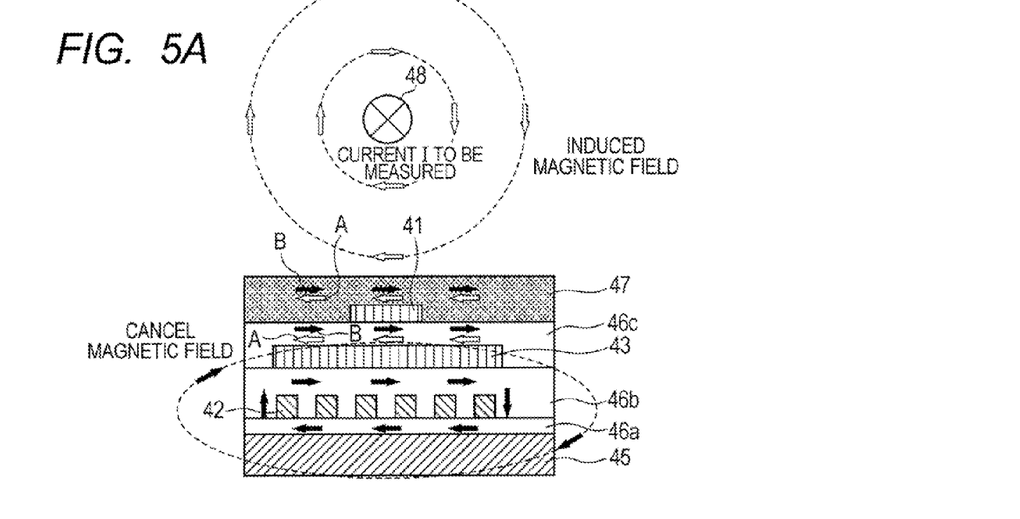
FIGS. 5A and 5B are diagrams illustrating a modification example of the magnetic balance type current sensor.

In addition, in the above-described embodiment, from a side close to the conductor 11, the feedback coil 121, the magnetic field attenuation unit 30, and the magnetoresistive effect elements 122 are constructed to be laminated on the substrate 21 in this order, but there is no limitation to this configuration. As shown in FIG. 5A, from a side close to a conductor 48, a magnetoresistive effect element 41, a magnetic field attenuation unit 43, and a feedback coil 42 may be constructed to be laminated on a substrate 45 in this order. For example, the feedback coil 42 is formed on an interlayer insulating film 46a on a side that is the closest to the substrate 45, the magnetic field attenuation unit 43 is formed on an interlayer insulating film 46b on a side that is the second closest to the second substrate 45, and the magnetoresistive effect element 41 is formed on an interlayer insulating film 46c that is the farthest from the substrate 45. Even with this configuration, since an induced magnetic field A that is applied to the magnetic field attenuation unit 43 due to the current I to be measured is attenuated by a cancel magnetic field B that is applied to the magnetic field attenuation unit 43 by a feedback current, magnetic saturation of the magnetic field attenuation unit 43 may be suppressed. In this case, it is preferable that a plane on which the magnetoresistive effect element 41 is formed be flat and clean. In addition, in a case where it is easy to design a package or it is easy to accurately form a distance between the current I to be measured and the magnetoresistive effect element by disposing the substrate on a side of the current I to be measured, it is effective to dispose the substrate 21 on a side of the current I to be measured by vertically inverting the current sensor shown in FIG. 3. In this case, the plane on which the magnetoresistive effect element is formed is a silicon thermal oxide film or an aluminum oxide film on the substrate, and the magnetoresistive effect element may be formed on a flat and clean plane.

Figure 5B:
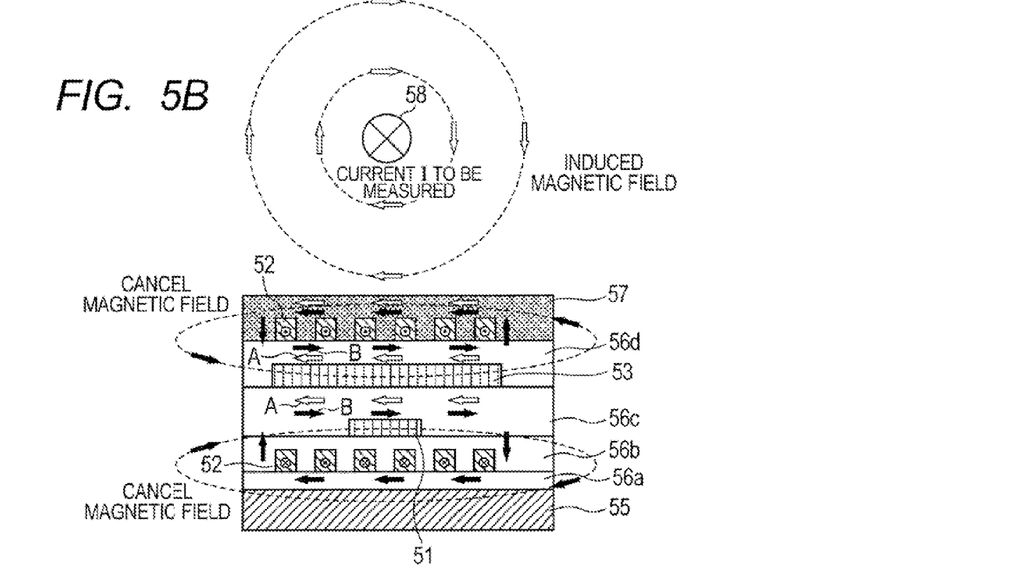

In addition, in the above-described embodiment, the feedback coil 121 is constructed as a planar coil, but there is no limitation to this configuration. The feedback coil 121 may be a coil to the extent that this coil generates a cancel magnetic filed that cancels the induced magnetic field from the current I to be measured. For example, as shown in FIG. 5B, the feedback coil 121 may be constructed as a tubular (spiral) coil.

In this case, a magnetic flux attenuation unit 53 and a magnetoresistive effect element 51 are disposed at an inner side of the tubular feedback coil 52. For example, a lower end side of the feedback coil 52 is formed on an interlayer insulating film 56a on a side that is the closest to a substrate 55, the magnetoresistive effect element 51 is formed on an interlayer insulating film 56b on a side that is the second closest to the substrate 55 at an inner side of the feedback coil 52, the magnetic field attenuation unit 53 is formed on an interlayer insulating film 56c on a side that is the third closest to the substrate 55 at an inner side of the feedback coil 52, and an upper end side of the feedback coil 52 is formed on an interlayer insulating film 56d on a side that is the farthest from the substrate 55. Even with this configuration, since an induced magnetic field A that is applied to the magnetic field attenuation unit 53 due to the current I to be measured is attenuated by a cancel magnetic field B that is applied to the magnetic field attenuation unit 53 by a feedback current, magnetic saturation of the magnetic field attenuation unit 53 may be suppressed.

In addition, in a case where the feedback coil 52 is constructed in a tubular coil, the feedback coil 52 may be formed on the substrate 55 by a thin film process, or may be formed to be wound around a conductive wire other than the substrate 55.

In addition, in the above-described embodiment, the magnetic field attenuation unit is formed in a thin plate shape, but there is no limitation to this configuration. The magnetic field attenuation unit may have any configuration to the extent that a magnetic field that acts on the magnetoresistive effect element may be attenuated by this configuration.

In addition, in the above-described embodiment, the feedback coil is provided so as to cause the cancel magnetic field to occur in a direction that is opposite to the direction of the induced magnetic field that is applied to the magnetic field attenuation unit, but there is no limitation to this configuration. The feedback coil may be provided so as to cause the cancel magnetic field to occur in an opposite direction in which the induced magnetic field applied to the magnetic field attenuation unit is attenuated.

As described above, in the magnetic balance type current sensor of this embodiment, since the magnetic saturation of the magnetic field attenuation unit is suppressed, the hysteresis is made sufficiently small, and thus measurement accuracy may be increased. In addition, miniaturization of the sensor and workability during installation thereof may be further improved compared to the configuration in which the magnetic sensor is disposed in the core gap of the magnetic core.

The present invention is not limited to the above-described embodiment, and may be implemented with various modifications. For example, the present invention may be implemented after appropriately modifying a material, a connection relationship between individual elements, a thickness, a size, a manufacturing method, and the like in the above-described embodiment. In addition, in the above-described embodiment, description has been made with respect to a case in which the magnetoresistive effect element is used for the magnetic balance type current sensor, but the magnetic balance type current sensor may be constructed using a hall element or any of other magnetic detection elements. In addition to this, the present invention may be implemented with appropriate modifications without departing from the scope of the present invention.

The present invention is applicable to a current sensor that detects the magnitude of a current used for driving a motor of an electric vehicle.

It should be understood by those skilled in the art that various modifications, combinations, sub-combinations and alterations may occur depending on design requirements and other factors insofar as they are within the scope of the appended claims of the equivalents thereof.

What is claimed is:

1. A magnetic balance type current sensor comprising:
   a magnetic sensor having an output varying due to an induced magnetic field applied from a current wire through which a current to be measured flows;
   a magnetic field attenuation member configured to attenuate the induced magnetic field applied to the magnetic sensor, the magnetic field attenuation member being disposed between the magnetic sensor and the current wire; and
   a feedback coil configured to generate a cancel magnetic field for cancelling the induced magnetic field based on the output of the magnetic sensor, a detection current corresponding to the current to be measured flowing through the feedback coil in flow when it a balanced state where the cancel magnetic field and the induced magnetic field cancel each other,
   wherein the feedback coil is provided such that a direction of the cancel magnetic field applied on the magnetic field attenuation member is opposite to a direction of the induced magnetic field applied on the magnetic field attenuation member.

2. The magnetic balance type current sensor according to claim 1,
   wherein the feedback coil is disposed between the magnetic field attenuation member and the current wire.

3. The magnetic balance type current sensor according to claim 1,
   wherein the feedback coil is formed in a tubular shape so as to accommodate the magnetic sensor and the magnetic field attenuation member therein.

4. The magnetic balance type current sensor according to claim 1, wherein the feedback coil is a planar coil.

5. A The magnetic balance type current sensor comprising:
   a magnetic sensor having an output varying due to an induced magnetic field applied from a current wire through which a current to be measured flows;
   a magnetic field attenuation member configured to attenuate the induced magnetic field applied to the magnetic sensor; and
   a feedback coil configured to generate a cancel magnetic field for cancelling the induced magnetic field based on the output of the magnetic sensor, a detection current corresponding to the current to be measured flowing through the feedback coil in flow when it a balanced state where the cancel magnetic field and the induced magnetic field cancel each other, wherein the feedback coil is provided such that a direction of the cancel magnetic field applied on the magnetic field attenuation member is opposite to a direction of the induced magnetic field applied on the magnetic field attenuation member, and wherein the magnetic sensor, the magnetic field attenuation member, and the feedback coil are laminated on a substrate in such an order that the magnetic field attenuation member is disposed between the feedback coil and the magnetic sensor.

6. The magnetic balance type current sensor according to claim 5, wherein the feedback coil is a planar coil.

* * * * *